United States Patent [19]
Van Dyk Soerewyn

[11] Patent Number: 4,538,168
[45] Date of Patent: * Aug. 27, 1985

[54] HIGH POWER SEMICONDUCTOR PACKAGE

[75] Inventor: Herman F. Van Dyk Soerewyn, Peabody, Mass.

[73] Assignee: Unitrode Corporation, Lexington, Mass.

[*] Notice: The portion of the term of this patent subsequent to Apr. 17, 2001 has been disclaimed.

[21] Appl. No.: 596,079

[22] Filed: Apr. 3, 1984

Related U.S. Application Data

[63] Continuation of Ser. No. 307,106, Sep. 30, 1981, abandoned.

[51] Int. Cl.³ .................... H01L 23/28; H01L 23/16; H01L 23/02
[52] U.S. Cl. ..................... 357/72; 357/75; 357/81; 174/52 PE; 361/388
[58] Field of Search .................... 357/72, 75, 81; 174/52 PE, 16 HS; 361/388, 389

[56] References Cited

U.S. PATENT DOCUMENTS

| 3,441,813 | 4/1969 | Takatsuka et al. | 357/72 |
| 3,475,662 | 10/1969 | Zido | 357/81 X |
| 3,539,803 | 11/1970 | Beerman | 357/75 X |
| 3,611,107 | 10/1971 | Ruckel | 357/81 X |
| 3,649,872 | 3/1972 | Garboushian | 357/81 X |
| 3,743,896 | 7/1973 | Weiske et al. | 357/81 X |
| 3,846,823 | 11/1974 | Matthews et al. | 357/81 X |
| 4,047,197 | 9/1977 | Schierz | 357/81 |
| 4,106,052 | 8/1978 | Schierz | 357/75 X |
| 4,107,727 | 8/1978 | Ikezawa et al. | 357/81 X |
| 4,278,990 | 7/1981 | Fichot | 357/81 |
| 4,443,655 | 4/1984 | Van Dyk Soerewyn | 357/72 |

Primary Examiner—Andrew J. James
Assistant Examiner—John Lamont
Attorney, Agent, or Firm—Weingarten, Schurgin, Gagnebin & Hayes

[57] ABSTRACT

A high power semiconductor package having a unitary extruded metal housing which serves as an efficient thermal heat sink and which includes integral constituents for retaining an encapsulating material. The extruded housing has open sides and an open top to facilitate installation of the semiconductor die assemblies and associated electronic components and terminals prior to enclosure in a molded or otherwise formed encapsulant.

13 Claims, 4 Drawing Figures

HIGH POWER SEMICONDUCTOR PACKAGE

This application is a continuation of application Ser. No. 307,106, filed Sept. 30, 1981, now abandoned.

FIELD OF THE INVENTION

This invention relates to electronic solid state power devices, and more particularly to a high power semiconductor package.

BACKGROUND OF THE INVENTION

Solid state devices are packaged in a variety of configurations to provide a component which can be mounted and electrically connected in an associated circuit. For high power applications, the power package usually includes a heat sink structure for thermal dissipation to prevent overheating and destruction of the sensitive semiconductor element or elements. Alternatively, the package is adapted for mounting on a heat sink during use to achieve the necessary thermal dissipation.

High power devices are generally packaged in one of three configurations. In one known form, the package includes a flat metal base plate with a plastic shell attached thereon and in which the semiconductor elements and terminals are disposed and retained by a potting material which fills the shell. In an alternative configuration, an encapsulant is molded onto the base plate and encloses the electronic components and terminals. In a further known configuration, a four-sided metal housing is cast or machined, typically from aluminum, and in which the components are mounted with the housing and thereafter filled with an encapsulant. The surrounding walls of the housing of a conventional high power package can be an impediment to the mounting of electronic components and terminals therein. The metal cast or machined housing also requires a number of fabrication steps, which adds to overall manufacturing cost.

SUMMARY OF THE INVENTION

In accordance with the present invention, a high power semiconductor package is provided in which a unitary housing is formed of a section of a metal extrusion containing integral constituents employed in completing a package fabrication, the housing serving as an efficient thermal heat sink as well as an inexpensive, rugged open-sided structural support for the package. A plurality of electrical terminal studs are disposed in the extruded housing, with outer portions of the studs providing terminal ends by which electrical connection is made. A plurality of semiconductor die assemblies are supported on and are in contact with the inner surface of the housing, one or more assemblies being electrically connected to each terminal stud. Other electronic components can also be contained within the housing to suit specific circuit requirements. After installation of the terminal studs and electronic components in the housing, the housing is encapsulated, preferably by a transfer molding process, to fully enclose the components and retain the components and terminal studs in position. The housing can be electrically isolated from the terminals by interposing an insulating plate between the die assemblies and the housing surface.

DESCRIPTION OF THE DRAWINGS

The invention will be more fully understood from the following detailed description taken in conjunction with the accompanying drawings, in which.

DETAILED DESCRIPTION OF THE INVENTION

Figure 1:
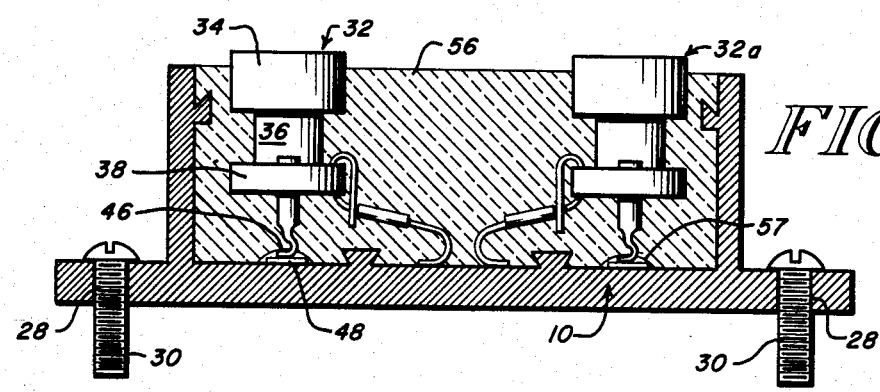
FIG. 1 is a sectional elevation view of a high power semiconductor package in accordance with the invention.
Figure 2:
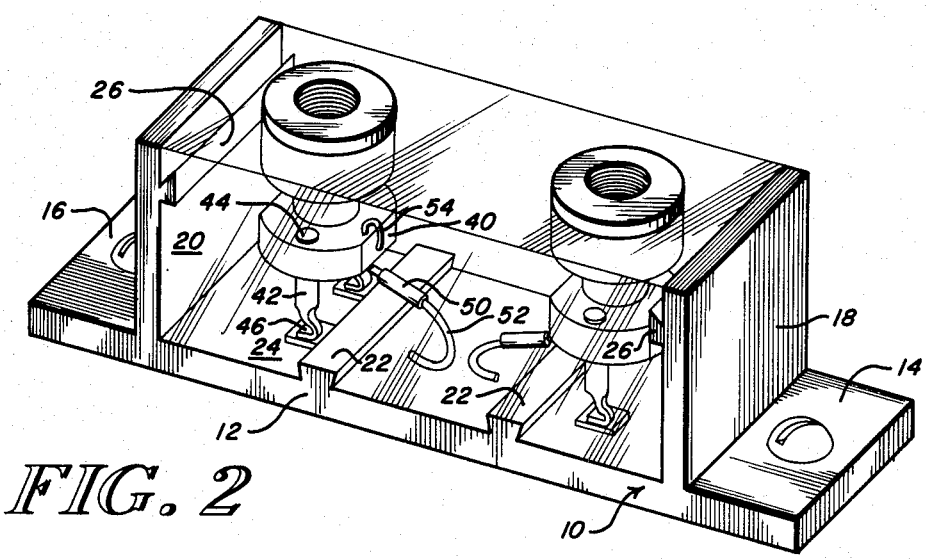
FIG. 2 is a pictorial view, partly in phantom, of the package of FIG. 1.

Referring to FIGS. 1 and 2 of the drawing, there is shown a high power semiconductor package constructed in accordance with the invention and which includes a housing 10 formed of an extruded metal member and cut to an intended width, will all constituents of this housing being integrally formed by the extrusion. The housing is of sufficient thickness to provide a thermal mass sufficient for proper heat sinking of the heat generated by the components in the housing. The housing 10 includes a rectangular bottom or base plate 12 terminating in ends 14 and 16 and having upstanding end walls 18 and 20 in spaced disposition at respective ends of the housing. Dovetail shaped flanges 22 are provided and are outwardly extending from the surface 24 of plate 12, and similar dovetail shaped flanges 26 are provided and are outwardly extending from the confronting surfaces of respective walls 18 and 20. These flanges serve to anchor an encapsulant, or potting material, which seals and encloses the operative elements of a rectifier, for example, as will be described. An opening 28 is provided in each end 14 and 16 and by which the package is retained on a mounting surface, such as by threaded fasteners 30.

In the illustrated embodiment, first and second terminal studs 32 and 32a are provided, each of identical construction. Terminal 32 will be described and includes a cylindrical head portion 34, intermediate cylindrical portion 36, and a section 38 of larger cross section than section 36 and having truncated side portions 40. A pair of conductive posts 42 are disposed in respective openings 44 in section 38, the outer end of each of the posts 42 terminating in a C-shaped contact 46 which is in electrical contact with the top terminal of a semiconductor die assembly 48, which typically includes a high power semiconductor device. This die assembly is mounted on surface 24 of the housing, by which electrical connection is made to the other die terminal. A low power dissipation active or passive electrical component 50 has one lead 52 in contact with housing surface 24 and the other lead 54 disposed in an opening in terminal section 38. During fabrication, the terminal studs 32 and 32a and associated die assemblies are retained in position in housing 10 by suitable fixturing apparatus, and the components are bonded such as by soldering to achieve electrical and mechanical connection of the die assemblies, posts 42 and component 50. More particularly, each die assembly is bonded to surface 24 and to the respective C-contact 46. Each post 42 is bonded to its terminal portion 38, and each component 50 is bonded to surface 24 and respective terminal.

After soldering of the assembly, a conformal coat 57 of material such as silicone is provided over each die assembly to accommodate differences in the coefficients of thermal expansion between the die assembly and the encapsulating material. The package is completed by enclosing the components and terminals with an encapsulating material 56 which is filled to the upper edges of walls 18 and 20 to fully enclose the package except for an exposed portion of the stud terminals 32 and 32a to which external electrical connection can be made. The encapsulating material is preferably provided by transfer molding of an epoxy or other suitable encapsulant within the housing 10. Alternatively, the encapsulant 56 can be provided by enclosing the sides of the housing 10 by mold walls and filling the housing interior with a potting compound, which may also be an epoxy material. The encapsulant is securely retained in the housing by the flanges 22 and 26 around which the encapsulating material flows prior to curing to its solid condition.

The housing 10 is typically made of an aluminum extrusion which is nickel-plated to prevent surface oxidation and to permit soldering. The terminals 32 and 32a are also of a conductive material such as nickel-plated copper, and the posts 42 are typically of copper. The die assembly 48 is itself of known construction and includes a suitable disk or plate on which the semiconductor chip is mounted and on top of which another plate or disk is bonded. The plates serve to provide thermal matching between the chip and the C-contact 46, and between the chip and the housing. A suitable material is typically molybdenum or tungsten. These plates also serve as the terminals by which the chip electrodes are connected.

Figure 3:
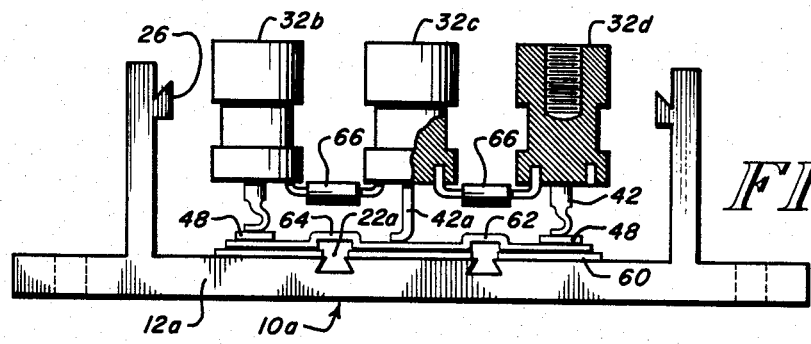
FIG. 3 is a side elevation view of an embodiment of the invention having electrically isolated terminals.
Figure 4:
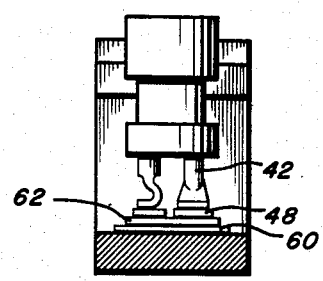
FIG. 4 is a sectional end elevation view of the embodiment of FIG. 3.

The package can also be constructed with electrical terminals which are electrically isolated from the conductive housing as shown in the embodiment of FIGS. 3 and 4. In this embodiment, three electrical terminals 32b, 32c, and 32d are provided, each of the construction described above. The housing 10a is substantially as described above, with dovetailed grooves 22a provided in plate 12a in place of the dovetailed flanges 22 employed in the above embodiment. Insulating plates 60 are provided on the surface of plate 12a, these plates typically being a ceramic or plastic electrically insulating material. A copper or other conductive strap 62 is disposed over the insulating plates 60 and on which the die assemblies 48 are mounted. The conductive strap 62 includes raised sections 64 which provide stress relief during thermal expansion and contraction of the strap. Each die assembly 48 is connected to respective terminals 32b and 32d by respective posts 42 as in the above embodiment. The center terminal 32c is connected directly to conductive strap 62 by way of a conductive post 42a. Components may be interconnected as required for a specific rectifier circuit, such as components 66 provided between adjacent pairs of terminals. In this embodiment all electrical terminals are electrically isolated from the housing, whereas in the embodiment of FIGS. 1 and 2, the housing serves as the common ground terminal for the rectifier circuit. Sealing of the components is accomplished by transfer molding or otherwise forming an electrically insulating encapsulant in the housing, in the manner described above.

In the illustrated embodiments, the housing is about 3.5 inches in length, about 1.0 inch in width, and about 0.75 inch in height. The thickness of the base plate is about 3/16 inch. Current carrying capacity of up to 300 amperes is easily achievable for this size package.

It will be appreciated that the housing can include various retaining elements integral therewith such as flanges 26 and grooves 22a in different combinations and positions within the housing for retention of the encapsulant. Accordingly, the invention is not to be limited by what has been particular shown and described except as indicated in the appended claims.

What is claimed is:

1. A high power semiconductor package comprising:
   a unitary extruded-metal housing having a bottom plate having ends, first and second end walls upstanding from the bottom plate and spaced from each other and from the ends of the bottom plate defining a planar open top and open side walls, the ends of the bottom plate including means for mounting the housing to a mounting surface;
   the housing including a plurality anchor elements integrally formed on at least one end wall and the bottom plate of said unitary extruded-metal housing;
   first and second electrical terminals disposed in spaced-apart relation in the housing, each having an outer end protruding from the planar open top of the housing and by which external electrical connection is made, and an inner end within the housing in spaced relation to the bottom plate of the housing;
   first and second semiconductor die assemblies;
   means for mounting the semiconductor die assemblies to the bottom plate in spaced-apart relation;
   means for electrically connecting the first and second die assemblies to the inner ends of corresponding ones of the terminals; and
   an encapsulant disposed in the housing between the upstanding end walls thereof, the encapsulant being secured by the anchor elements of the housing.

2. The package of claim 1 wherein said first and second semiconductor die assemblies each include a power semiconductor device electrically connected to the bottom plate.

3. The package of claim 2 further including a low power electrical component disposed in the housing and connected between a selected electrical terminal and the housing.

4. The package of claim 1, wherein said first and second semiconductor die assemblies each include a power semiconductor device electrically isolated from said housing.

5. The package of claim 4 further including a conformal electrically insulating plate on the bottom of the housing; and
   a conformal electrically conductive strap mounted on the insulating plate, said first and second semiconductor die assemblies are mounted on the conformal electrically conductive strap.

6. The package of claim 5 wherein the electrically conductive strap includes stress relief sections to accommodate thermal expansion and contraction of the strap.

7. The package of claim 1 including a conformal coat of material over the first and second die assemblies and operative to accommodate differences in the coefficients of thermal expansion between each die assembly and the encapsulant.

8. A high power semiconductor package comprising:
   a unitary extruded-metal housing having a long axis, and having a bottom plate having ends, first and second end walls upstanding from the bottom plate and spaced from each other along the long axis and from the ends of the bottom plate defining open side walls and an open planar top, the ends of the bottom plate including means for mounting the housing to a mounting surface;

the housing including a plurality of anchor elements integrally formed on the end walls and on the bottom plate;

first and second electrical terminals disposed in the housing in spaced-apart relation along the long axis, each having an outer end protruding from the planar top of the housing and by which external electrical connection is made, and an inner end within the housing in spaced relation to the bottom of the housing;

first and second semiconductor die assemblies, each mounted in spaced-apart relation along the long axis of the housing and mechanically adjacent the inner ends of the first and second electrical terminals on the bottom plate and each including a power semiconductor device;

each of the electrical terminals including a first conductive post;

means for electrically connecting the first posts of said first and second electrical terminals to respective ones of said first and second semiconductor die assemblies; and an encapsulant disposed in the housing between the upstanding walls thereof, the encapsulant being secured by the anchor elements of the housing.

9. The package of claim 8 further including a low-power dissipation electrical component disposed in the housing and mechanically and electrically connected between one of the electrical terminals and the housing.

10. The package of claim 8 wherein each of the electrical terminals includes a section of enlarged cross-section intermediate the outer and the inner ends thereof;

each of said first and second conductive posts having inner and outer ends, the inner end of each post being supported by and extending from the section of enlarged cross-section of the corresponding terminal, the outer end of each of the posts having an electrical contact portion.

11. A high power semiconductor package, comprising:

a unitary extruded-metal housing a bottom plate having ends, first and second end walls upstanding from the bottom plate and spaced from each other and from the ends of the bottom plate defining open sidewalls and a planar open top, the ends of the bottom plate including means for mounting the housing to a mounting surface;

the housing including a plurality of anchor elements integrally formed on and outwardly extending from at least one of said end walls and formed on the bottom plate;

first, second, and third electrical terminals disposed in the housing, each having an outer portion protruding from the housing and by which external electrical connection is made, and an inner end within the housing in spaced relation to the bottom plate of the housing;

at least one conformal electrically insulating plate disposed on the bottom plate of the housing;

an electrically conductive strap disposed on the insulating plate and extending beneath each of the electrical terminals;

first and second semiconductor die assemblies, each mounted in spaced-apart relation on the conductive strap and each including a power semiconductor device;

said first and second terminals each including a first conductive post on its inner end electrically connected to a respective one of said first and second die assemblies;

said third terminal including a conductive post connected to the conductive strap; and an encapsulant disposed in the housing between the upstanding walls thereof, the encapsulant being secured by the anchor elements of the housing.

12. The package of claim 8, wherein each of the electrical terminals includes a second post;

further including third and fourth semiconductor die assemblies; and means for electrically connecting said third and fourth semiconductor die assemblies to respective second posts of said first and second electrical terminals.

13. The package of claim 11, wherein each of said first and second electrical terminals further includes a second conductive post, and further including third and fourth semiconductor die assemblies, said second post of the first electrical terminal electrically connected to the third semiconductor die assembly, and said second post of said second electrical terminal electrically connected to the fourth semiconductor die assembly.

* * * * *